US009419642B1

(12) United States Patent
Nguyen

(10) Patent No.: US 9,419,642 B1
(45) Date of Patent: Aug. 16, 2016

(54) ULTRA LOW POWER DUAL QUANTIZER ARCHITECTURE FOR OVERSAMPLING DELTA-SIGMA MODULATOR

(71) Applicant: ANALOG DEVICES, INC., Norwood, MA (US)

(72) Inventor: Khiem Quang Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/736,419

(22) Filed: Jun. 11, 2015

(51) Int. Cl.
H03M 3/00 (2006.01)

(52) U.S. Cl.
CPC .............. *H03M 3/32* (2013.01); *H03M 3/352* (2013.01); *H03M 3/464* (2013.01); *H03M 3/498* (2013.01)

(58) Field of Classification Search
CPC ..... H03M 1/74; H03M 1/0665; H03M 3/464; H03M 3/424; H03M 3/448; H03M 3/322; H03M 3/452
USPC .................................................. 341/118–155
See application file for complete search history.

(56) References Cited

U.S. PATENT DOCUMENTS

| 6,271,782 | B1 | 8/2001 | Steensgaard-Madsen | |
|---|---|---|---|---|
| 7,095,345 | B2 | 8/2006 | Nguyen et al. | |
| 7,119,725 | B1 * | 10/2006 | Shih | H03M 1/0665 341/143 |
| 8,779,957 | B2 | 7/2014 | Rajaee et al. | |
| 9,184,754 | B2 * | 11/2015 | Huang | H03M 1/001 |
| 2005/0275577 | A1 * | 12/2005 | Bjornsen | H03M 3/46 341/155 |
| 2013/0119902 | A1 * | 5/2013 | Gries | H02M 1/15 318/400.3 |
| 2015/0236660 | A1 * | 8/2015 | Klugbauer-Heilmeier | H03F 3/217 330/251 |

OTHER PUBLICATIONS

J. Silva et al., "Wideband Low-Distortion Delta-Sigma ADC Topology", © IEE 2001, Electronic Letters Online No. 20010542, Apr. 20, 2001, 2 pages.
José Silva et al., "Low-Distortion Delta-Sigma Topologies for Mash Architectures", 0-7803-8251-X/04 © 2004 IEEE, ISCAS 2004, pp. I-1144-I-1147, 4 pages.
MT-022 Tutorial, ADC Architectures III: Sigma-Delta ADC Basics by Walter Kester, Analog Devices, Inc., Rev. A, 10/08, WK © 2009, Analog Devices, Inc. 12 pages.
MT-023 Tutorial, ADC Architectures IV: Sigma-Delta ADC Advanced Concepts and Applications by Walter Kester, Analog Devices, Inc., Rev. A, 10/08, WK, © 2009, Analog Devices, Inc., 11 pages.
Xiaolong Yuan, Licentiate Thesis in Electronics and Computer Systems, Stockholm, Sweden 2010, 111 pages.

(Continued)

*Primary Examiner* — Lam T Mai
(74) *Attorney, Agent, or Firm* — Patent Capital Group

(57) ABSTRACT

Power consumption of analog-to-digital converters (ADCs) is one important requirement for automotive and consumer devices. One flavor of an ADC is a dual quantizer architecture for oversampling delta-sigma modulators. The dual quantizer delta-sigma modulator has a first quantizer for digitizing the output of the loop filter and a second quantizer for digitizing the input of the quantizer. However, the quantization noise of the second quantizer is a highly correlated signal and significantly degrades the spectrum of the delta-sigma modulator. To address this issue, an improvement to the dual quantizer architecture is made to cancel the quantization noise of the second quantizer that is digitizing the input. Furthermore, the improvement allows the second quantizer to run at a much slower sampling rate than the first quantizer. Advantageously, the improvement provides reduction in power consumption and the overall area of modulator.

20 Claims, 6 Drawing Sheets

(56) References Cited

OTHER PUBLICATIONS

Ahmed Gharbiya et al., "On the Implementation of Input-Feedforward Delta-Sigma Modulators", IEEE Transactions on Circuits and Systems—II: Express Briefs, vol. 53, No. 6, Jun. 2006, 1057-7130 © 2006, IEEE pp. 453-457, 5 pages.

Kheim Nguyen et al., "A 105dB SNR Multibit ΣΔ ADC for Digital Audio Applications", 0-7803-6591-7/01 © 2001 IEEE, IEEE 2001 Customer Integrated Circuits Conference, pp. 27-30, 4 pages.

Ahmed Gharbiya, "Architecture Alternatives for Time-Interleaved and Input-Feedforward Delta-Sigma Modulators", © 2008 Ahmed Gharbiya, 136 pages.

Kheim Nguyen et al., "A 106dB SNR Hybrid Oversampling ADC for Digital Audio", ISSCC 2005 / Session 9 / Switched Capacitor ΔΣ Modulators / 9.6, Analog Devices, Inc., Wilimington, MA, 0-7803-8904-2/05, © 2005 IEEE, 3 pages.

\* cited by examiner

US 9,419,642 B1

ULTRA LOW POWER DUAL QUANTIZER ARCHITECTURE FOR OVERSAMPLING DELTA-SIGMA MODULATOR

TECHNICAL FIELD OF THE DISCLOSURE

The present invention relates to the field of integrated circuits, in particular to a low power dual quantizer architecture for oversampling delta-sigma modulators.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs are used in a broad range of applications including communications, energy, healthcare, instrumentation and measurement, motor and power control, industrial automation and aerospace/defense. ADCs can translate analog electrical signals representing real-world phenomenon, e.g., light, sound, temperature, or pressure for digital processing.

BRIEF SUMMARY OF THE DISCLOSURE

Power consumption of analog-to-digital converters (ADCs) is one important requirement for automotive and consumer devices. One flavor of an ADC is a dual quantizer architecture for oversampling delta-sigma modulators. The dual quantizer delta-sigma modulator has a first quantizer for digitizing the output of the loop filter and a second quantizer for digitizing the input of the quantizer. However, the quantization noise of the second quantizer is a highly correlated signal and significantly degrades the spectrum of the delta-sigma modulator. To address this issue, an improvement to the dual quantizer architecture is made to cancel the quantization noise of the second quantizer that is digitizing the input. Furthermore, the improvement allows the second quantizer to run at a much slower sampling rate than the first quantizer. Advantageously, the improvement provides reduction in power consumption and the overall area of modulator.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Analog-to-Digital Converters (ADCs)

Analog to digital converters (ADCs) are electronic devices that convert a continuous physical quantity carried by an analog signal to a digital bits that represents the quantity's amplitude. The conversion involves quantization of the analog input signal, so conversion would introduce a small amount of error. Typically the quantization is performed by periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its power consumption, its size or area on silicon, its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements. Each application may have different requirements. Some applications may require very low power consumption, and designing for low power is not trivial.

Understanding Delta-Sigma Analog-to-Digital Converters (DS ADCs)

Analog-to-digital converters (ADCs) based on delta-sigma (DS) modulation (referred to herein as "DS ADCs", or in some cases as "DS modulators") have been widely used in digital audio and high precision instrumentation systems. A DS ADC usually provides the advantage of being able to convert an analog input signal to a digital signal with high resolution at low cost. Typically, a DS ADC encodes an analog signal using a delta-sigma modulator. A quantizer can be used for this purpose, employing, e.g., a low resolution ADC. If applicable, the DS ADC can apply a digital filter to the output of the DS modulator to form a higher-resolution digital output.

Figure 1:
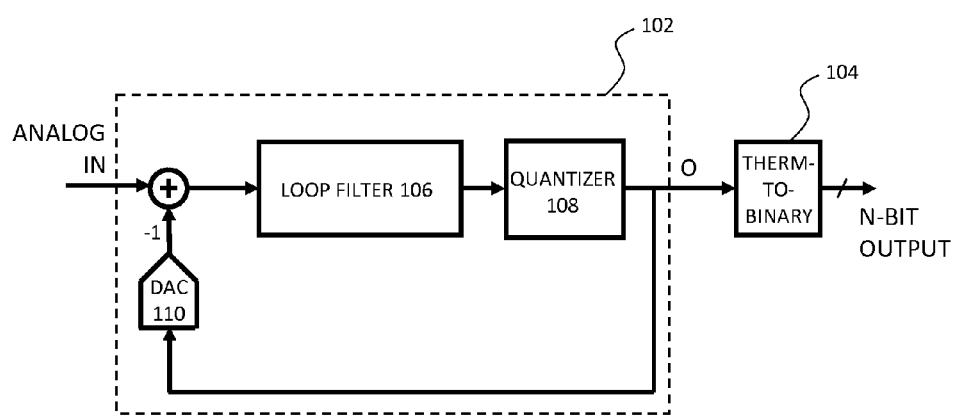
FIG. 1 illustrates a basic delta-sigma analog-to-digital converter, according to some embodiments of the disclosure.

FIG. 1 shows an exemplary delta-sigma analog-to-digital converter (DS ADC). The DS ADC comprises a delta-sigma modulator part 102. The DS ADC, if needed, can also include a thermometer code to binary encoder 104. The delta-sigma modulator part 102 of the DS ADC can process an analog input signal ("ANALOG IN") and generate a digital output signal (e.g., thermometer codes) representing the analog input signal at a digital output ("O") of the delta-sigma modulator part. The thermometer code to binary encoder 104 can generate an N-bit output based on the digital output signal. The overall DS ADC is thus able to convert the analog input signal into an N-bit output.

Generally, a delta-sigma modulator part 102 would include a loop filter 106, a quantizer 108 (e.g., a coarse ADC, a multi-bit flash ADC, etc.), and a feedback digital-to-analog converter (DAC) 110. The principle operation of a delta-sigma modulator involves (1) using a quantizer with a high oversampling ratio, and (2) implementing error feedback with a loop filter for noise shaping. Even though the quantizer 108 is coarse (e.g., on its own, the quantizer can introduce a substantial amount of quantization error), oversampling at a sufficiently high oversampling ratio can distribute the quantization noise over a wide bandwidth and noise shaping can push the quantization noise to higher frequencies. As seen in FIG. 1, the loop filter 106 is included to provide error feedback for the delta-sigma modulator and to shape the noise from the quantizer 108 out of baseband to higher frequencies. Making up part of the loop filter 106 is one or more stages or integrators, and the number of stages/integrators depends on the order of the loop filter 106. Higher order loop filters can provide more noise shaping, but at the cost of complexity, power, and area. To provide error feedback, the error is usually generated by taking the difference between the original analog input signal and a reconstructed version of the original analog input signal (i.e., a feedback signal), which is generated using a feedback digital-to-analog-converter (DAC) 110. The feedback DAC 110 converts the digital output signal at the digital output O back into an analog signal as the feedback signal (i.e., the reconstructed version of the original analog input signal). Depending on the order of the loop filter, more integrators and corresponding feedback paths (not shown) can be provided for a higher order loop filter.

Dual Quantizer Architecture

Figure 2:
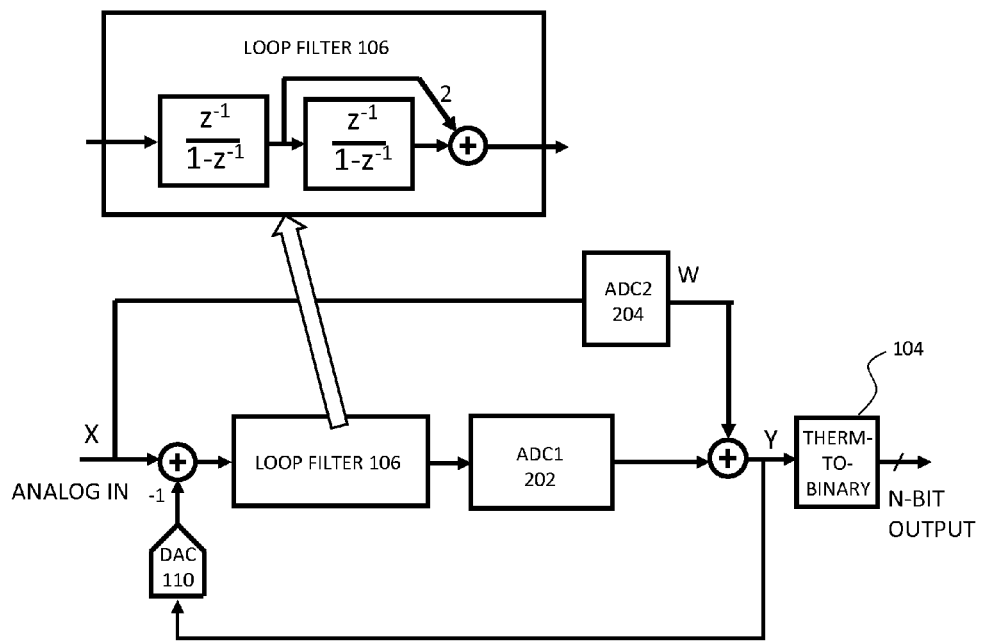
FIG. 2 shows a dual quantizer architecture for an oversampling delta-sigma converter, according to some embodiments of the disclosure.

Many designs modifying the basic delta-sigma modulator shown in FIG. 1 have been proposed for addressing various design requirements. One of such designs is the dual quantizer architecture, which aims to reduce the input signal content in the signal chain. FIG. 2 shows a dual quantizer architecture for an oversampling delta-sigma converter. In the dual quantizer architecture, as stated by the name, two quantizers are used: ADC1 202 and ADC2 204. ADC1 202 digitizes the output of the loop filter 106, and ADC2 204 (the additional quantizer) digitizes the analog input signal ("ANALOG IN") to the delta-sigma modulator. The output of ADC2 204 is added to the output of ADC1 202, and the loop filter 106 only has to process the quantization noise of ADC1 202. Without the additional quantizer, ADC2 204, the loop filter would have to process the quantization noise of ADC1 202 and the input signal. The reduction or removal of the input signal content in the loop filter can reduce the signal swing in the delta-sigma modulator, and thus headroom requirements are relaxed. Accordingly, the entire delta-sigma modulator can be implemented with low voltage circuits that consume very little power.

The dual quantizer architecture can be understood as follows. Suppose the loop filter 106 is a second order loop filter with discrete-time integrators, each integrator can be represented by:

$$\frac{z^{-1}}{1-z^{-1}}.$$

Let $W=X+q_2$, where W is the output of ADC2 204, X is the analog input signal to the delta-sigma modulator, and $q_2$ is the quantization noise of ADC2 204. Then, the digital output of the delta-sigma modulator ("Y") is as follows: $Y=X+q_1(1-z^{-1})^2+q_2(1-z^{-1})^2$, where $q_1$ is the quantization noise of ADC1 202. One important issue of this dual quantizer architecture shown in FIG. 2 is that the use of ADC2 204 introduces additional quantization noise $q_2$ in the delta-sigma modulator. The quantization noise $q_2$ of ADC2 204 is a highly correlated signal which can significantly degrade the spectral content of Y even when the quantization noise $q_2$ is shaped by the second order high-pass filter.

Modified Dual Quantizer Architecture with Quantization Noise Cancellation

Figure 3:
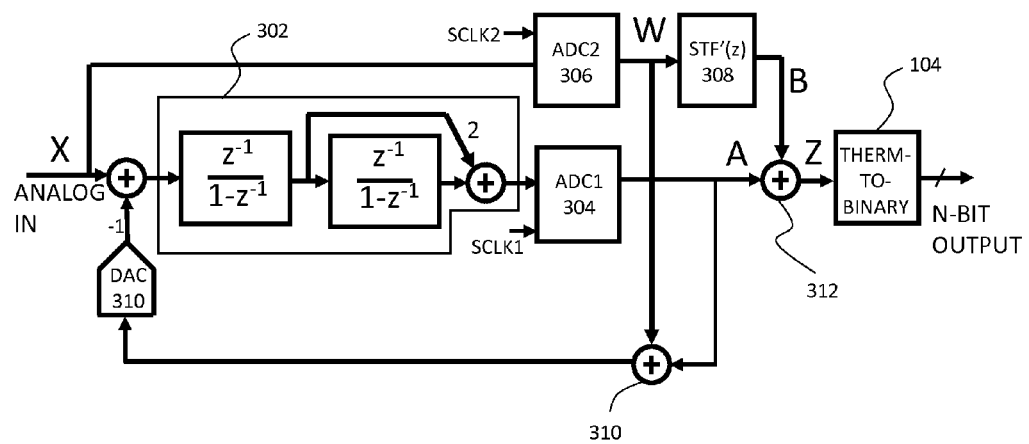
FIG. 3 shows a modified dual quantizer architecture for an oversampling delta-sigma converter, according to some embodiments of the disclosure.

Realizing the issue of the quantization noise of the additional ADC in the dual quantizer architecture, the dual quantizer architecture is modified such that the quantization noise of the additional ADC is (substantially) cancelled at the digital output of the delta-sigma modulator. FIG. 3 shows a modified dual quantizer architecture for an oversampling delta-sigma converter, according to some embodiments of the disclosure. The delta-sigma modulator part of the converter can be a (ultra) low power delta-sigma modulator having a dual quantizer architecture that can process an analog input signal ("X") and generate a digital output signal ("Z") representing the analog input signal at a digital output. The delta-sigma modulator has a loop filter 302, a first ADC (ADC1) 304 having a digital output signal ("A"), a second (ADC2) 306 having a digital output signal ("W"), and a feedback DAC 310.

The modification to the dual quantizer architecture involves taking the output of the ADC2 306 ("W"), which has the digital representation of the input signal X and the quantization noise $q_2$ of ADC2 306 ($W=X+q_2$), and injecting W to the input of the feedback DAC 310 of the feedback path along with the digital output signal A of ADC1 304. By providing W to the input of the feedback DAC 310, the loop of the delta-sigma modulator estimating a digital output signal ("A") is now assisted by the estimate provided by the output of ADC2 306 ("W"). Phrased differently, by providing the feedback DAC 310 with a coarse estimate W of the input signal, the high precision loop processing a difference between the input signal X and a feedback signal generated by the feedback DAC 310 can better estimate and generate the digital output signal A. The modification further involves adding a digital signal processing block STF'(z) 308 at the output of ADC2 306, where STF'(z) 308 is a digital re-creation of the loop filter 302 signal transfer function (STF) in the z-domain. In this example, the loop filter 302 is a second-order discrete-time loop filter (although it does not necessarily have to be a second-order discrete-time loop filter), and the STF(z) can be represented by:

$$STF(z)=-2z^{-1}+z^{-2}$$

The filtered output B of ADC2 306 is combined with the digital output signal A. Accordingly, the digital output Z can be represented by:

$$Z=X+q_1(1-z^{-1})-q_2(STF(z))+q_2(STF'(z))$$

When STF(z) and STF'(z) match, then the digital output Z is reduced to just the input X plus the spectrally shaped quantization noise $q_1$ of ADC1 304, and the quantization noise $q_2$ of ADC2 306 is effectively cancelled at the digital output Z of the delta-sigma modulator. Advantageously, the cancellation of the quantization noise $q_2$ of ADC2 306 also means that the non-linearity of ADC2 306 would not affect the overall spectrum of the delta-sigma modulator.

The modified dual quantizer architecture can be implemented with one or more advantageous features. Since ADC2

306 is outside of the loop of the delta-sigma modulator, it is possible to run ADC1 304 and ADC2 306 at different rates (which can relax the design requirements for ADC2 302). For instance, a (ultra) low power delta-sigma modulator can include a loop filter 302 (of a suitable order, e.g., second order or higher) for processing an error between the analog input signal X to the delta-sigma modulator and a feedback signal from a feedback DAC 310, a first analog-to-digital converter (ADC1 304) for digitizing an output of the loop filter 302 of the delta-sigma modulator at a first sampling rate (based on sampling clock SCLK1), and a second ADC (ADC2 306) for digitizing the analog input signal to the delta-sigma modulator at a second sampling rate different (based on sampling clock SCLK2) from the first sampling rate. The quantization noise $q_2$ of the second ADC (ADC2 306) is cancelled at the digital output Z of the delta-sigma modulator.

The feedback path now processes the output W of ADC2 306 and output A of ADC1 304, and the delta-sigma modulator includes a first combining part 302 (e.g., an adder or summation unit) for combining an output A of the first ADC (ADC1 304) and an output W of the second ADC (ADC2 306) to generate a combined signal. The feedback DAC 310 converts the combined signal to generate the feedback signal.

To cancel the quantization noise $q_2$ of the second ADC (ADC2 306), the delta-sigma modulator includes a second combining part 312 (e.g., an adder or summation unit) for combining an output A of the first ADC (ADC1 304) and a filtered output B of the second ADC (ADC2 306) to generate the digital output Z of the delta-sigma modulator.

The digital signal processing block STF'(z) 308 representing the loop filter can process the output of the second ADC (ADC2 306) and generate the filtered output B of the second ADC (ADC2 306). The digital signal processing block STF' (z) 308 can include a digital filter matching the loop filter for filtering the output of the second ADC2 306. In embodiments where the delta-sigma modulator (e.g., loop filter 302) is implemented with discrete-time circuitry, STF'(z) 308 can match very well to STF(z) as both are in discrete-time domain.

Referring back to ADC1 304 and ADC2 306 running at different sampling rates, the delta-sigma modulator can achieve ultra low power when the second sampling rate of ADC2 306 is (significantly) slower than the first sampling rate of ADC1 304 (faster sampling rate generally means the ADC would consume much more power). In other words, ADC2 306 does not have to operate at the modulator clock rate (e.g., first sampling rate of ADC1 304). Only a relative low oversampling ratio is needed for ADC2 306 which leads to substantial reduction in the power consumption of the overall modulator. For instance, ADC2 306 can work with an oversampling ratio of 4, or 8. The only block would operate at the modulator clock rate is the STF'(z) 308. Relaxing the sampling rate of ADC2 306 means that simpler (but slower) ADC architectures can be used. For instance, ADC2 306 can be implemented using a successive approximation register (SAR) ADC architecture, which can greatly reduce the overall modulator silicon area.

Low Power Method for Analog-to-Digital Conversion

Figure 4:
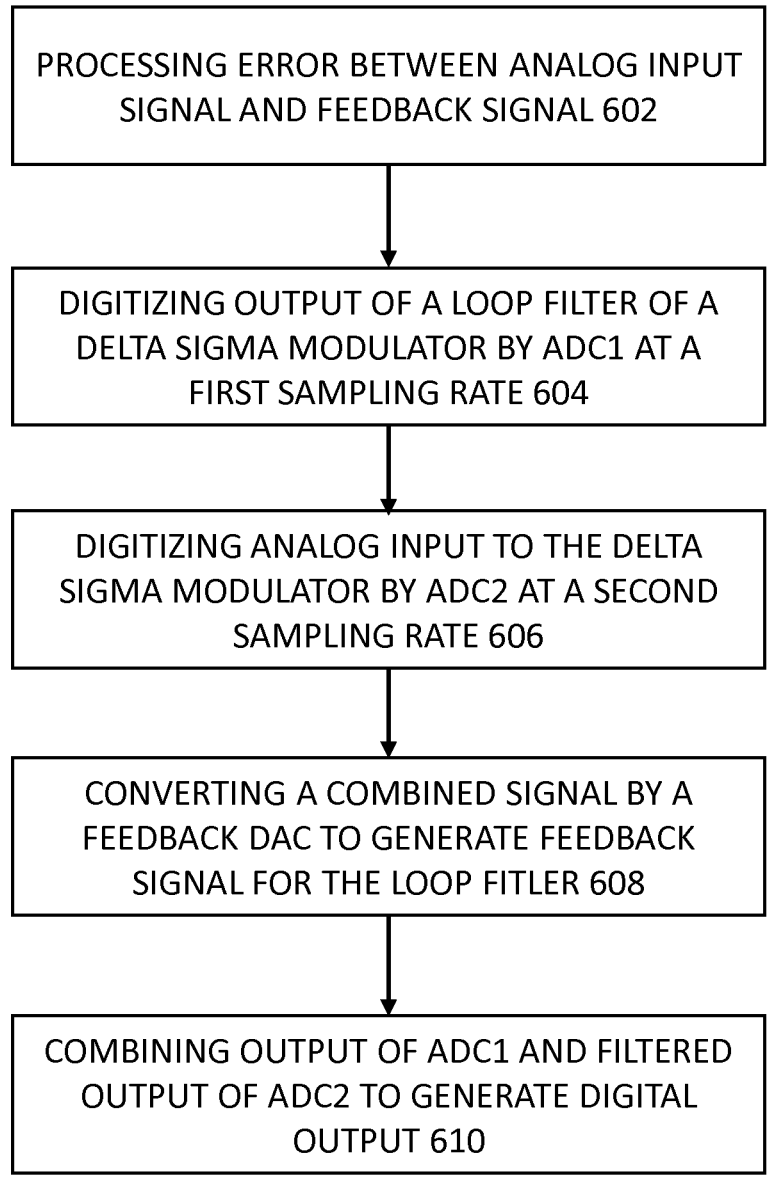
FIG. 4 is a flow diagram illustrating a low power method for processing, by a delta-sigma modulator having a dual quantizer architecture, an analog input signal and generating a digital output signal representing the analog input signal at a digital output of the delta-sigma modulator, according to some embodiments of the disclosure.

FIG. 4 is a flow diagram illustrating a low power method for processing, by a delta-sigma modulator having a dual quantizer architecture, an analog input signal and generating a digital output signal representing the analog input signal at a digital output of the delta-sigma modulator, according to some embodiments of the disclosure. The method illustrated can be carried out by the circuitry shown in FIGS. 3, 5 and 6. A loop filter processes an error between the analog input signal and a feedback signal from a feedback digital-to-analog converter (DAC) (task 602). A first analog-to-digital converter (ADC) digitizes an output of a loop filter of the delta-sigma modulator at a first sampling rate (task 604). A second ADC digitizes analog input signal to the delta-sigma modulator at a second sampling rate different from the first sampling rate (task 606). A feedback digital-to-analog converter (DAC) converts a combined signal combining outputs of the first ADC and the second ADC to generate the feedback signal (task 608). A combining part combines an output of the first ADC and a filtered output of the second ADC to generate the digital output of the delta-sigma modulator (task 610). A digital processing block representing the loop filter filters the output of the second ADC to generate the filtered output of the second ADC. Advantageously, the delta-sigma modulator can cancel a quantization noise of the second ADC at the digital output of the delta-sigma modulator.

Hybrid Loop Filter

Referring back to FIG. 3, the example shows a loop filter 302 of a second-order having purely discrete-time circuitry (i.e., implemented using switch-capacitor circuits). In a full discrete-time design, switched capacitor circuits have the inherent advantage of allowing frequency scaling, which means the loop filter can accept any frequency clock in an ultra low power converter, when you give a master clock to clock the modulator.

In particular, the front-end of the (purely discrete-time) loop filter 302 has a first stage/integrator has a sampling network, which means the first stage/integrator has large switch and large capacitor (where the switch is driven by the sampling clock). When the sampling clock clocks the switch of the discrete-time front end, the switch injects its harmonics out to the analog input pin of the delta-sigma modulator (thus the chip). The analog input pin has a trace out onto board which acts as an antenna, and the chip can radiate a lot of emissions. For some applications, radiating emissions can cause the chip to fail emissions tests. Instead of having purely discrete-time circuitry, the loop filter can have a continuous-time front end instead, making the loop filter a hybrid loop filter with front end continuous-time circuitry and a back-end with discrete-time circuitry.

Figure 5:
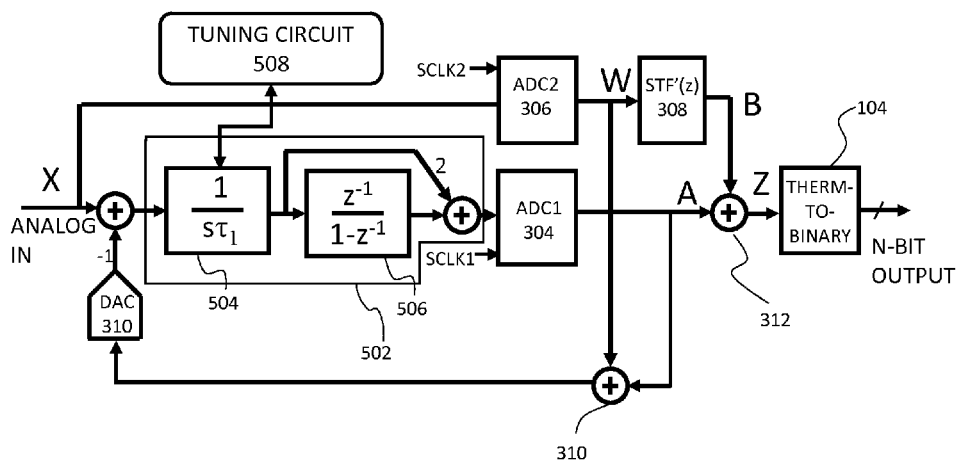
FIG. 5 illustrates variants of the modified dual quantizer architecture for an oversampling delta-sigma converter, according to some embodiments of the disclosure.

FIG. 5 illustrates variants of the modified dual quantizer architecture for an oversampling delta-sigma converter, according to some embodiments of the disclosure. The loop filter 502 a continuous-time front end and a discrete-time back end (referred herein as the "CT-DT hybrid loop filter"). In this example where the loop filter 502 is a second order loop filter, the first stage 504 is implemented with continuous-time circuitry (e.g., RC circuits, represented by transfer function $$\left(e.g., RC \text{ circuits, represented by transfer function } \frac{1}{s\tau_1}\right),$$

and the second stage 506 is implemented with discrete-time circuitry $$\left(e.g., \text{ switched capacitor circuits, represented by transfer function } \frac{z^{-1}}{1-z^{-1}}\right).$$

Accordingly, processing the error between the analog input signal and the feedback signal by feedback DAC 310 comprises processing the error using a continuous-time front end (which may have one integrator or stage) and a discrete-time back end (which may have one or more integrators or stages). Advantages of the continuous-time front end include on-chip couplings and inherent anti-aliasing. Instead of having purely switched capacitor circuitry for the loop filter 502, the front end can be implemented with continuous-time circuitry, i.e., using resistors, capacitors, and operational amplifiers. The analog input signal thus goes through a pure input resistor into an integrator (having an opamp with negative feedback using a feedback capacitor) without any switches. The result is a continuous-time front end having a load that can be driven without injecting harmonics via the analog input in out to the chip. The back end can have discrete-time circuitry without affecting the overall system. In some cases, using the bilinear transformation, a designer can transform a discrete-time front end into a continuous-time front end (even for higher order discrete-time loop filters) to a hybrid CT-DT loop filter.

If desired, both the front end and the back end can be implemented with continuous-time circuitry. For a second order loop filter, the first stage 504 and the second stage 506 can both be implemented with continuous-time circuitry.

One issue of having a continuous-time front end (or any continuous-time circuitry in the loop filter) is that R's and C's (resistors and capacitors) of the circuitry can cause the STF of the front end to change with process, voltage and temperature variations. Thus the overall STF delta-sigma-modulator would change with process, voltage and temperature variations. When the STF'(z) 308 is to match or track the STF of the loop filter 502, circuitry may be needed to track the changing STF and such circuitry can be computationally demanding.

To achieve the advantages of having continuous-time circuitry of the front end, yet require no tracking of STF, a tuning circuit 508 can be provided to tune the R's and C's of the continuous-time front end (e.g., first stage 504). One example of a tuning circuit 508 is described in U.S. Pat. No. 7,095,345 (Nguyen et al.), which is hereby incorporated by reference in its entirety. An exemplary tuning circuit 508 can have a digital finite state machine and an analog tuning circuit for keeping an RC product of the continuous-time first stage substantially constant across conditions including one or more of: process, temperature, supply, and sampling rate. The second stage 506 having discrete-time circuitry would require no tuning at all. Accordingly, any mismatch between STF(z) and STF'(z) can be kept minimal so as to not affect the overall performance and spectral content of the delta-sigma modulator.

In some embodiments, a tuning circuit can be provided to tune a continuous-time loop filter having a continuous-time front end and a continuous-time back end.

In some embodiments, the continuous-time front end includes a modified continuous-time integrator, and the integrator is controlled by a tuning circuit 508. The modified continuous-time integrator 504 can have a pair of switches in series with input resistors and, and an amplifier. The switches can be controlled by a tuning circuit 508. Programmable capacitor arrays are provided for the modified continuous-time integrator (an array comprises many capacitors in parallel as feedback capacitors of the integrator, and are individually controllable to be switched in or out of the circuit). The programmable capacitor arrays are controlled by the tuning circuit 508. The tuning circuit 508 can include a digital finite state machine and an analog control block. The finite stage machine can include several D flip-flops and combinational logics to control the programmable capacitor arrays in the analog tuning circuit and also the capacitor arrays in the continuous-time integrator. The implementation of the finite state machine can be either in a hardware description language or simply by manual design. The result is a tuning circuit 508 that can control the R's and C's of the continuous-time front end.

Simplifying the Main Quantizer and Scrambling

Referring back to FIG. 2, ADC1 202 is traditionally a multi-bit flash ADC which employs $2^R$ comparators where R is the resolution of the ADC1 202. In one example, ADC1 has 8 levels, which means there are at least 8 comparators. Having a large number of comparators is a major drawback when implementing a delta-sigma modulator in an ultra-low power design environment. Furthermore, the delay requirement through these comparators, dictated by the loop design, is very short. This fast response time requirement makes the comparator design very power hungry.

With the modified dual quantizer architecture illustrated by FIGS. 3 (5 and 6), the loop filter now only processes mainly the quantization $q_2$ error of ADC2, ADC1 does not have to be a full multi-bit flash ADC (as required by conventional delta-sigma modulators). Instead, ADC1 (e.g., ADC1 304 of FIGS. 3, 5 and 6) can be reduced to having and generating at most three output levels. For instance, ADC1 can be reduced flash ADC with only +1, −1 and 0 output levels. Using a reduced flash ADC can reduces the modulator silicon area since a fast embedded flash ADC is no longer needed. Advantageously, a fast ADC can be implemented for ADC1 with reduced complexity, smaller area, and lower power consumption. The result is an ultra low power multi-bit oversampling delta-sigma modulator.

Figure 6:
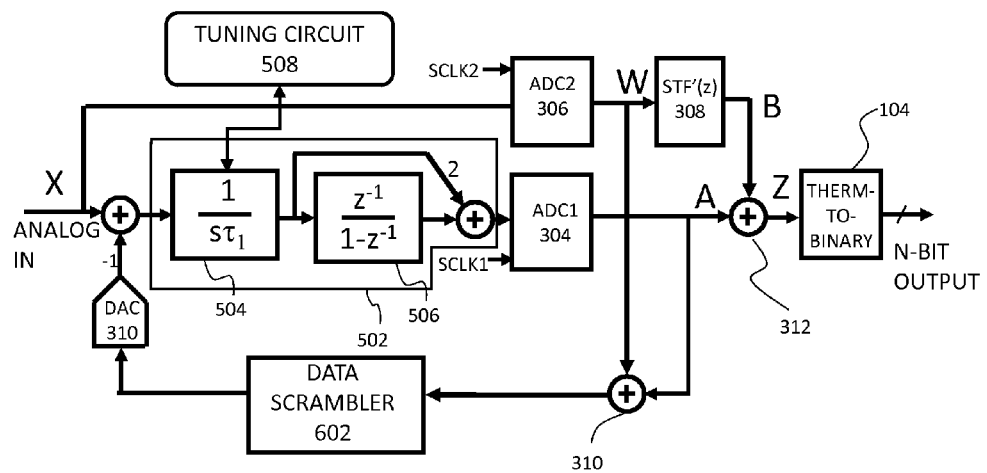
FIG. 6 illustrates another variant of the modified dual quantizer architecture for an oversampling delta-sigma converter, according to some embodiments of the disclosure.

FIG. 6 illustrates another variant of the modified dual quantizer architecture for an oversampling delta-sigma converter, according to some embodiments of the disclosure. Besides reduction of complexity, the linearity of the feedback DAC 310 is improved by a data scrambler 602 for scrambling digital output signal of the combined signal (W+A) using dynamic element matching. Scrambling the combined signal (W+A) using dynamic element matching can average out mismatches in sub-DACs in the feedback DAC 310 to reduce distortions in the feedback signal generated by the feedback DAC 310, which in turn can improve the overall performance of the delta-sigma modulator. To implement dynamic element matching, data scrambler 602 can scramble the digital output signal of the combined signal (W+A), e.g., in a random manner, by using a random code that controls a switch matrix for routing the digital output signal of the combined signal (W+A) to sub-DACs of the feedback DAC 310. The random code can control the routing so that the sub-DACs are selected or used at random so that the noise from the sub-DACs is modulated. While some designers are concerned with delay incurred by a data scrambler 602 due to strict delay timing requirements of the loop design, a three-level dynamic element matching data scrambler does not require a substantial amount of circuitry or excessive delay. Therefore, the data scrambler 602 can be implemented in the feedback path with minimal delay, thus minimally affecting the loop delay of the delta-sigma modulator.

Resolution of ADC2 Versus ADC1

With the modified dual-quantizer architecture, ADC2 provides a coarse estimate of the analog input signal X. Generally speaking, ADC2 would have a resolution of 2 W, where W is the word width of the modulator output. In most cases, ADC2's resolution is higher than ADC1. During operation, ADC2 converts the analog input signal X with sufficiently high resolution to match the resolution of the modulator output (e.g., 4-bit resolution), while ADC1 converts primarily the quantization noise $q_2$ of ADC2 (e.g., 1.5-bit resolution) as the input to ADC1 fluctuates around 0 and 1 LSB. Because ADC2 can run at a much lower sampling rate, it is possible to provide a relatively higher resolution ADC without much added circuit complexity, power consumption, and area (e.g., using a simple architecture such as the SAR ADC). Other architectures of ADC2 are envisioned by the disclosure, including: flash ADC, cyclic ADC, and pipeline ADC.

Variations and Implementations

The embodiments described herein are particularly useful for low power, low voltage applications, such as consumer electronics (e.g., mobile devices), automobile electronics, etc. In certain contexts, the features discussed herein can be applicable to devices wherever low power analog-to-digital data conversion is desired, e.g., wearable devices, distributed devices used in Internet of Things, sensing devices, medical devices, wireless and wired communications, industrial process control, audio and video equipment, and other digital-processing-based systems. In general, electronic devices with limited power can leverage the ultra-low power design to perform data conversion.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various delta-sigma modulators/converters can include electronic circuitry to perform the functions described herein. The circuitry can operate in analog domain, digital domain, or in a mixed signal domain. In one example embodiment, any number of electrical circuits of the FIGURES may be implemented on a board of an associated electronic device, e.g., interfacing or implemented with an analog front end for converting analog signals to digital signals for storage or further processing. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense. Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to data conversion, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A delta-sigma modulator having a dual quantizer architecture for processing an analog input signal and generating a digital output signal representing the analog input signal at a digital output, the delta-sigma modulator comprising:
   a loop filter for processing an error between the analog input signal to the delta-sigma modulator and a feedback signal from a feedback digital-to-analog converter (DAC);
   a first analog-to-digital converter (ADC) for digitizing an output of the loop filter of the delta-sigma modulator at a first sampling rate; and
   a second ADC for digitizing the analog input signal to the delta-sigma modulator at a second sampling rate different from the first sampling rate;
   wherein a quantization noise of the second ADC is cancelled at the digital output of the delta-sigma modulator.

2. The delta-sigma modulator of claim 1, further comprising:
   a first combining part for combining an output of the first ADC and an output of the second ADC to generate a combined signal, wherein the feedback DAC converts the combined signal to generate the feedback signal.

3. The delta-sigma modulator of claim 1, further comprising:
   a second combining part for combining an output of the first ADC and a filtered output of the second ADC to generate the digital output of the delta-sigma modulator.

4. The delta-sigma modulator of claim 3, further comprising:
   a digital processing block representing the loop filter for processing an output of the second ADC and generating the filtered output of the second ADC.

5. The delta-sigma modulator of claim 1, wherein the second sampling rate is slower than the first sampling rate.

6. The delta-sigma modulator of claim 1, wherein the loop filter comprises a continuous-time front end and a discrete-time back end.

7. The delta-sigma modulator of claim 5, further comprising:
   a tuning circuit having a digital finite state machine and an analog tuning circuit for keeping an RC product of the continuous-time first stage substantially constant across conditions including one or more of: process, temperature, supply, and sampling rate.

8. The delta-sigma modulator of claim 1, wherein the first ADC has at most three output levels.

9. The delta-sigma modulator of claim 2, further comprising:
   a data scrambler for scrambling digital output signal of the combined signal using dynamic element matching.

10. A method for processing, by a delta-sigma modulator having a dual quantizer architecture, an analog input signal and generating a digital output signal representing the analog input signal at a digital output of the delta-sigma modulator, the method comprising:
    processing, by a loop filter, an error between the analog input signal and a feedback signal from a feedback digital-to-analog converter (DAC);
    digitizing, by a first analog-to-digital converter (ADC), an output of a loop filter of the delta-sigma modulator at a first sampling rate;
    digitizing, by a second ADC, the analog input signal to the delta-sigma modulator at a second sampling rate different from the first sampling rate;
    converting, by a feedback digital-to-analog converter (DAC), a combined signal combining outputs of the first ADC and the second ADC to generate the feedback signal; and
    combining an output of the first ADC and a filtered output of the second ADC to generate the digital output of the delta-sigma modulator.

11. The method of claim 10, further comprising:
    cancelling, by the delta-sigma modulator, a quantization noise of the second ADC at the digital output of the delta-sigma modulator.

12. The method of claim 10, further comprising:
    filtering, by a digital processing block representing the loop filter, the output of the second ADC to generate the filtered output.

13. The method of claim 10, wherein the second sampling rate is slower than the first sampling rate.

14. The method of claim 10, wherein processing the error between the analog input signal and the feedback signal comprises processing the error using a continuous-time front end and a discrete-time back end.

15. The method of claim 14, further comprising:
    tuning, using a tuning circuit having a digital finite state machine and an analog tuning circuit, an RC product of the continuous-time first stage substantially constant across conditions including one or more of: process, temperature, supply, and sampling rate.

16. The method of claim 10, wherein digitizing, by the first ADC comprises generating at most three output levels.

17. The method of claim 10, further comprising:
    scrambling the combined signal using dynamic element matching.

18. A delta-sigma modulator having a dual quantizer architecture for converting an analog input signal and generating a digital output signal representing the analog input signal at a digital output of the delta-sigma modulator, the modulator comprising:
    means for processing an error between the analog input signal and the feedback signal from a feedback digital-to-analog converter (DAC);
    means for digitizing an output of a loop filter of the delta-sigma modulator at a first sampling rate;
    means for digitizing the analog input signal to the delta-sigma modulator at a second sampling rate different from the first sampling rate;
    means for converting a combined signal combining outputs of the first analog-to-digital converting means and the second analog-to-digital converting means to generate the feedback signal; and
    means for combining an output of the first ADC and a filtered output of the second ADC to generate the digital output of the delta-sigma modulator.

19. The modulator of claim 18, further comprising:
    a digital filter matching the loop filter for filtering an output of the second ADC to generate the filtered output.

20. The modulator of claim 18, wherein the second sampling rate is slower than the first sampling rate.

* * * * *